(12) United States Patent
Lee et al.

(10) Patent No.: US 11,531,153 B2
(45) Date of Patent: Dec. 20, 2022

(54) LIGHTING MODULE AND LIGHTING DEVICE COMPRISING SAME

(71) Applicant: LG INNOTEK CO., LTD., Seoul (KR)

(72) Inventors: Dong Hyun Lee, Seoul (KR); Moo Ryong Park, Seoul (KR); Young Jae Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/436,719

(22) PCT Filed: Mar. 19, 2020

(86) PCT No.: PCT/KR2020/003807
§ 371 (c)(1),
(2) Date: Sep. 7, 2021

(87) PCT Pub. No.: WO2020/197171
PCT Pub. Date: Oct. 2, 2020

(65) Prior Publication Data
US 2022/0146738 A1     May 12, 2022

(30) Foreign Application Priority Data
Mar. 22, 2019   (KR) .................. 10-2019-0033189

(51) Int. Cl.
*F21V 8/00*     (2006.01)
*F21V 7/05*     (2006.01)
*F21V 19/00*    (2006.01)

(52) U.S. Cl.
CPC .............. *G02B 6/0045* (2013.01); *F21V 7/05* (2013.01); *F21V 19/0015* (2013.01); *G02B 6/005* (2013.01)

(58) Field of Classification Search
CPC ......... G02B 6/0045; G02B 6/005; F21V 7/05; F21V 19/0015
See application file for complete search history.

(56) References Cited

U.S. PATENT DOCUMENTS 7,455,441 B2   11/2008   Chosa et al.
7,491,977 B2   2/2009    Fukasawa
(Continued)

FOREIGN PATENT DOCUMENTS

CN          101876407         11/2010
DE     10 2011 002 340        10/2012
(Continued)

OTHER PUBLICATIONS

International Search Report dated Jul. 6, 2020 issued in Application No. PCT/KR2020/003807.
(Continued)

*Primary Examiner* — Fatima N Farokhrooz
(74) *Attorney, Agent, or Firm* — KED & Associates, LLP

(57) ABSTRACT

A lighting device disclosed in an embodiment of the invention includes a substrate; a plurality of light emitting devices on the substrate; a first reflective layer on the substrate; a resin layer on the first reflective layer and including a first surface from which light emitted from the light emitting device is extracted; a second reflective layer on the resin layer; and a light extraction layer on the first surface of the resin layer, wherein the first surface of the resin layer has a convex portion having a convex exit surface facing to each of the light emitting devices, and concave portions between the convex portions, and the light extraction layer may include a first extraction portion having protrusions on each exit surface, and second extraction portions concave between the plurality of protrusions.

20 Claims, 8 Drawing Sheets

(56) References Cited

U.S. PATENT DOCUMENTS

| | | |
|---|---|---|
| 8,247,831 B2 | 8/2012 | Jagt |
| 9,429,701 B2 | 8/2016 | Lee et al. |
| 9,535,191 B2 | 1/2017 | Tazawa |
| 9,978,917 B1 | 5/2018 | Ye et al. |
| 10,648,626 B2 | 5/2020 | Hwang |
| 2007/0109792 A1 | 5/2007 | Chosa et al. |
| 2011/0018020 A1* | 1/2011 | Jagt .................. H01L 33/60 |
| | | 257/E33.072 |
| 2018/0372279 A1 | 12/2018 | Lim et al. |
| 2019/0137046 A1* | 5/2019 | Hwang ............. F21S 43/239 |

FOREIGN PATENT DOCUMENTS

| | | |
|---|---|---|
| EP | 1670 069 | 6/2006 |
| JP | 5666306 | 2/2015 |
| KR | 10-2011-0003266 | 1/2011 |
| KR | 10-2014-0047412 | 4/2014 |
| KR | 10-2015-0025728 | 3/2015 |
| KR | 10-2017-0074035 | 6/2017 |
| KR | 10-2017-0132058 | 12/2017 |

OTHER PUBLICATIONS

Extended European Search Report dated Nov. 2, 2022 issued in Application No. 20777766.5.

* cited by examiner

LIGHTING MODULE AND LIGHTING DEVICE COMPRISING SAME

CROSS-REFERENCE TO RELATED PATENT APPLICATIONS

This application is a U.S. National Stage Application under 35 U.S.C. § 371 of PCT Application No. PCT/KR2020/003807, filed Mar. 19, 2020, which claims priority to Korean Patent Application No. 10-2019-0033189, filed Mar. 22, 2019, whose entire disclosures are hereby incorporated by reference.

TECHNICAL FIELD

An embodiment of the invention relates to a lighting module having a plurality of light sources and a lighting device having the same. An embodiment of the invention relates to a lighting module that provides a surface light source in a form of a line. An embodiment of the invention relates to a lighting device having a lighting module, a light unit, a liquid crystal display device, or a vehicle lamp.

BACKGROUND ART

Lighting applications include vehicle lights as well as backlights for displays and signs. Light emitting device, such as light emitting diode (LED), have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since an emission angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

DISCLOSURE

Technical Problem

An embodiment of the invention provides a lighting module for irradiating a surface light source in the form of a line in one direction and a lighting device having the same. An embodiment of the invention provides a lighting module for irradiating light emitted from a plurality of light emitting devices as a line-shaped light source or a surface light source, and a device having the same. An embodiment of the invention provides a lighting device for irradiating light in a direction to one side of the resin layer by disposing a resin layer between the substrate and the reflective layer. An embodiment of the invention provides a lighting device in which a resin layer having a light emitting device is disposed between a plurality of reflective layers. An embodiment of the invention provides a lighting device in which a light extraction layer is disposed on an emitting surface of a resin layer having a light emitting device between a plurality of reflective layers. An embodiment of the invention may provide a light unit having a lighting module, a liquid crystal display, and a vehicle lamp.

Technical Solution

A lighting device according to an embodiment of the invention includes a substrate; a plurality of light emitting devices disposed on the substrate; a first reflective layer disposed on the substrate; a resin layer disposed on the first reflective layer and including a first surface from which light emitted from the light emitting device is extracted; a second reflective layer disposed on the resin layer; and a light extraction layer disposed on the first surface of the resin layer, wherein the first surface of the resin layer has convex portions having a convex exit surface facing to each of the light emitting devices, and a plurality of concave surfaces between the convex portions, and the light extraction layer may include a first extraction portion having a plurality of protrusions disposed on the first surface of the resin layer and a second extraction portion disposed on the first extraction portion.

According to an embodiment of the invention, the light extraction layer may be disposed on one side of the substrate and the first and second reflective layers. The first surface of the resin layer may be an outer surface between the first and second reflective layers, and a vertical height of the first extraction portion may be greater than a thickness of the resin layer. The resin layer includes a recess portion concave toward a second surface facing to the first surface of the resin layer, and the resin layer includes third and fourth surfaces facing to each other on both sides of the first and second surfaces, and the light extraction layer may be disposed on the concave surface. The light extraction layer may extend to a third surface and a fourth surface of the resin layer. The maximum width of the first extraction portion may be smaller than a height of a vertical direction, and a side cross-sectional shape of the first extraction portion may include a hemispherical shape or a triangular shape. The light extraction layer may include any one of PTN, PET, and PEN. The exit surface of the resin layer overlaps each of the light emitting devices in a first direction, the concave surface does not overlap the light emitting device in the first direction, and the first exit portion may overlap each of the plurality of light emitting devices in a plurality. The inner surface of the light extraction layer may be adhered along the first surface of the resin layer. A portion of each of the plurality of light emitting devices may be disposed in a virtual circle passing through each of the plurality of convex portions.

Advantageous Effects

According to an embodiment of the invention, it is possible to improve the luminosity of light emitted from the lighting device in the form of a line having a small height and a long length. According to an embodiment of the invention, a line-shaped surface light source may be provided through between the plurality of reflective layers in the lighting device. Since a resin layer covering the light emitting device is formed between the plurality of reflective layers, a process of the lighting module may be simplified, light loss may be reduced, and light efficiency may be improved. According to an embodiment of the invention, since the lighting module having a thin thickness is provided in the form of a line light source, a degree of design freedom may be increased. It is possible to improve the light uniformity of the surface light source emitted between the plurality of reflective layers. It is possible to improve the optical reliability of the lighting module and the lighting device having the same according to an embodiment of the invention.

The reliability of a vehicle lighting device having a lighting module according to an embodiment of the invention is improved, and may be applied to a light unit, various display devices, a surface light source lighting device, or a vehicle lamp.

BEST MODE

Figure 1:
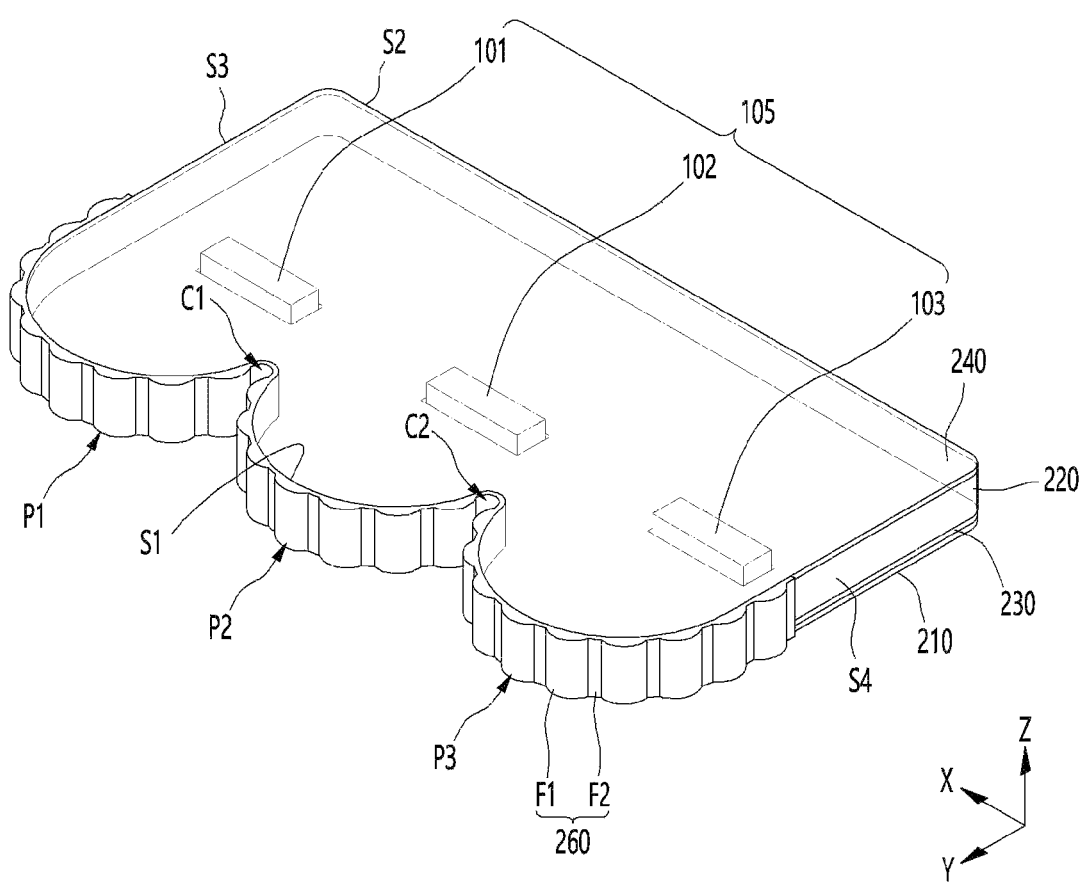
FIG. 1 is a perspective view showing a lighting device according to an embodiment of the invention.

Hereinafter, with reference to the accompanying drawings will be described in detail preferred embodiments that may be easily carried out by the person of ordinary skill in the art. However, it should be understood that the configurations shown in the embodiments and drawings described in this specification are only preferred embodiments of the invention, and that there may be various equivalents and modifications that can replace them at the time of application. In the detailed description of the operating principle for the preferred embodiment of the invention, when it is determined that a detailed description of related known functions or configurations may unnecessarily obscure the subject matter of the invention, the detailed description will be omitted. Terms to be described later are terms defined in consideration of functions in the invention, and the meaning of each term should be interpreted based on the contents throughout the present specification. The same reference numerals are used for parts having similar functions and functions throughout the drawings. The lighting device according to the invention may be applied to various lamp devices that require lighting, such as vehicle lamps, household lighting devices, and industrial lighting devices. For example, when applied to vehicle lamps, head lamps, car lights, side mirror lights, fog lights, tail lamps, brake lights, daytime running lights, vehicle interior lights, door scars, rear combination lamps, backup lamps It is applicable to back. The lighting device of the invention may be applied to indoor and outdoor advertising devices, display devices, and various electric vehicle fields. In addition, it may be applied to all lighting-related fields or advertising-related fields that are currently developed and commercialized or may be implemented according to future technological development.

Hereinafter, the embodiments will be apparent through the description of the accompanying drawings and embodiments. In the description of the embodiments, each layer (film), region, pattern or structure is formed "on" or "under" of the substrate, each layer (film), region, pad or patterns. In the case described as, "on" and "under" include both "directly" or "indirectly" formed through another layer. In addition, the criteria for the top or bottom of each layer will be described based on the drawings.

<Lighting Device>

Figure 2:
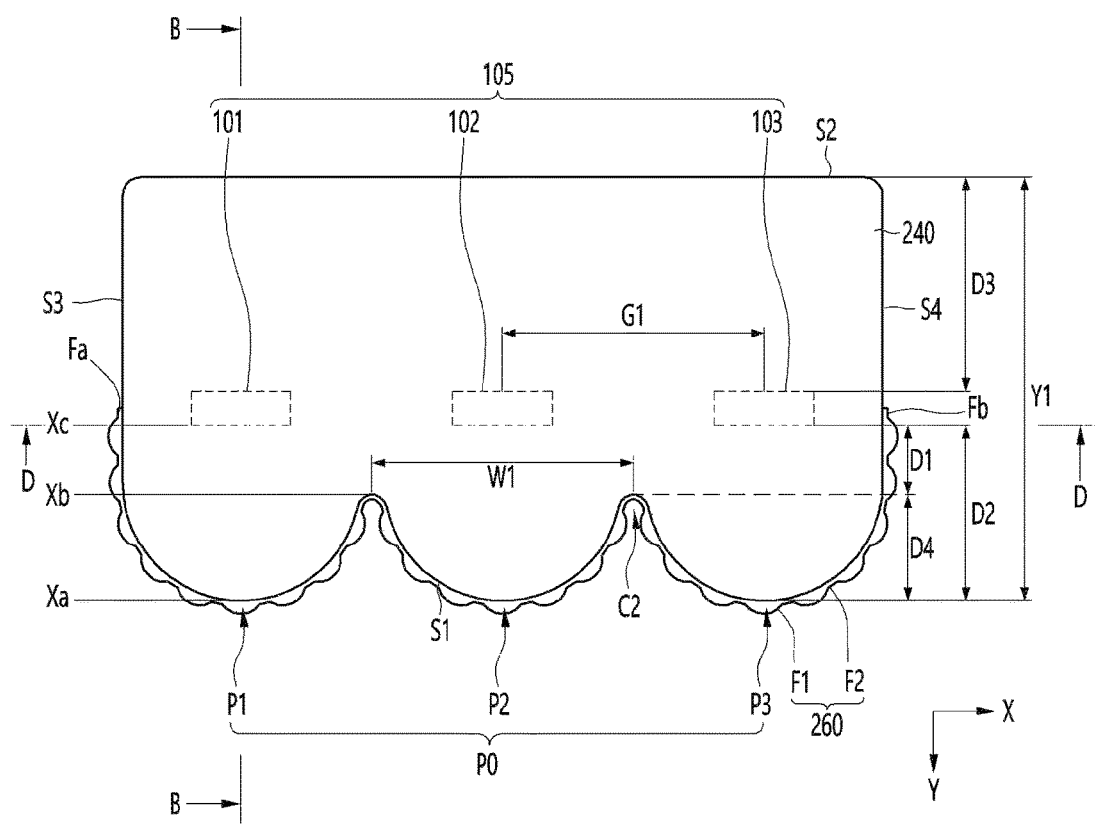
FIG. 2 is a plan view of the lighting device of FIG. 1.
Figure 3:
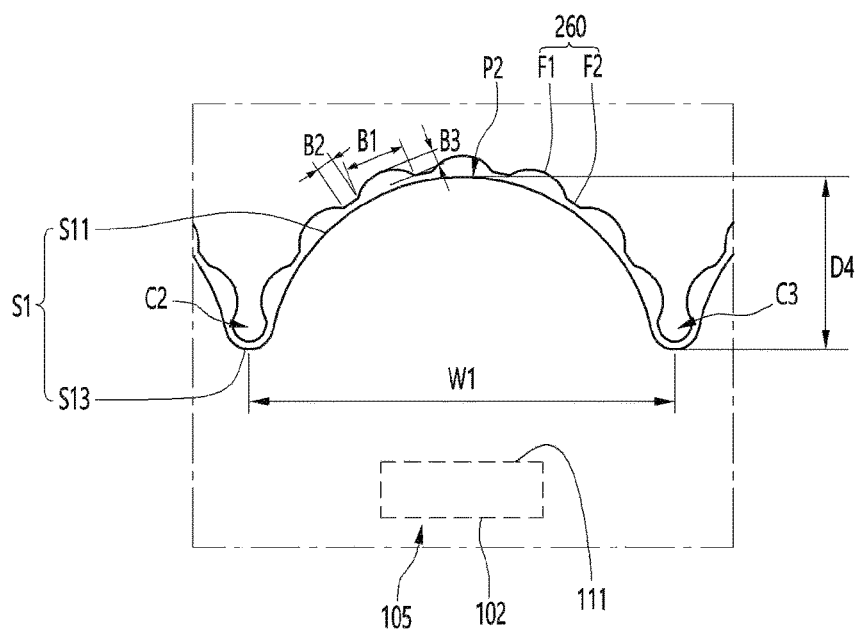
FIG. 3 is a view showing a detailed structure of a light extraction layer provided on a first surface of the lighting device of FIG. 2.
Figure 4:
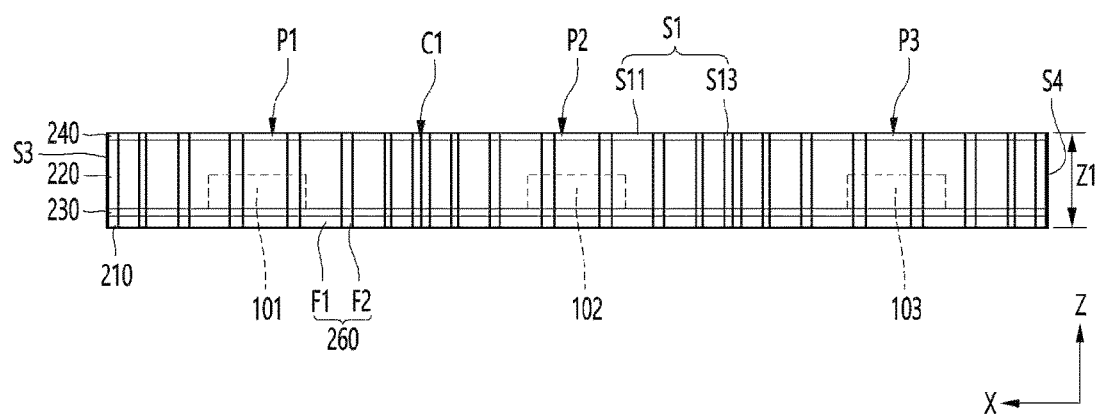
FIG. 4 is an example of a front view of the lighting device of FIG. 1.
Figure 5:
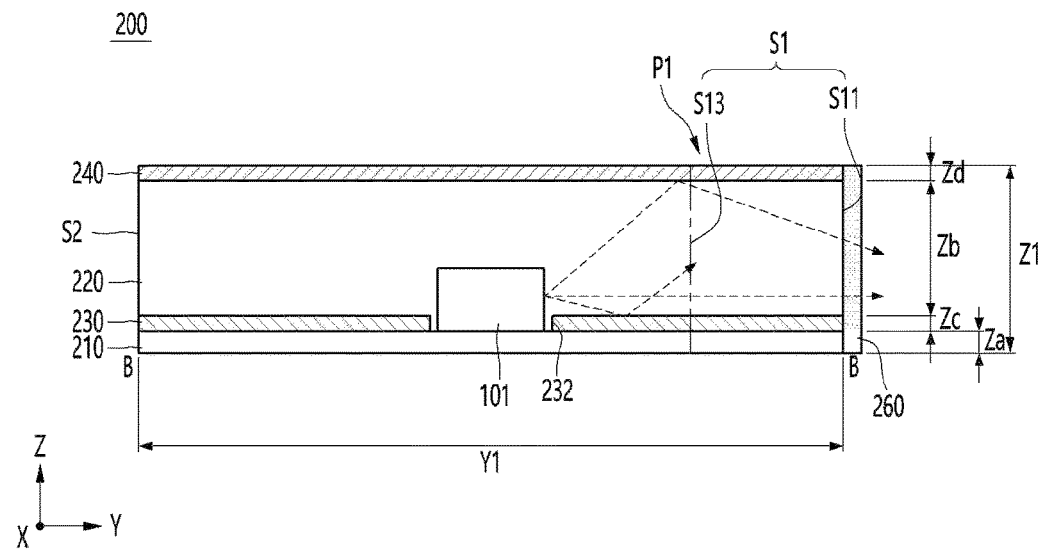
FIG. 5 is a cross-sectional view taken along a B-B side of the lighting device of FIG. 2.
Figure 6:
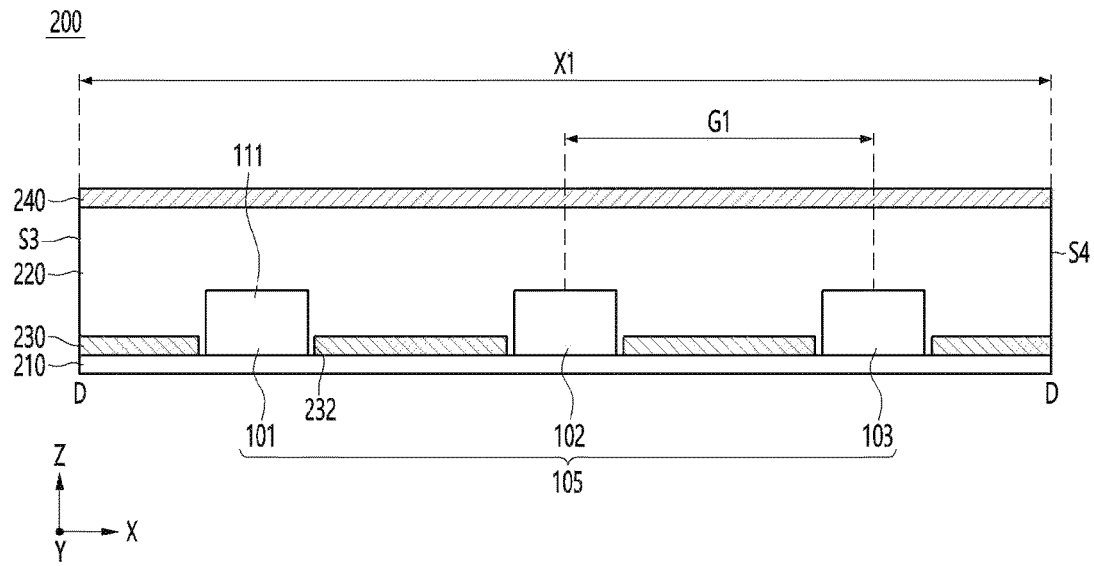
FIG. 6 is a cross-sectional view taken along a C-C side of the lighting device of FIG. 2.
Figure 7:
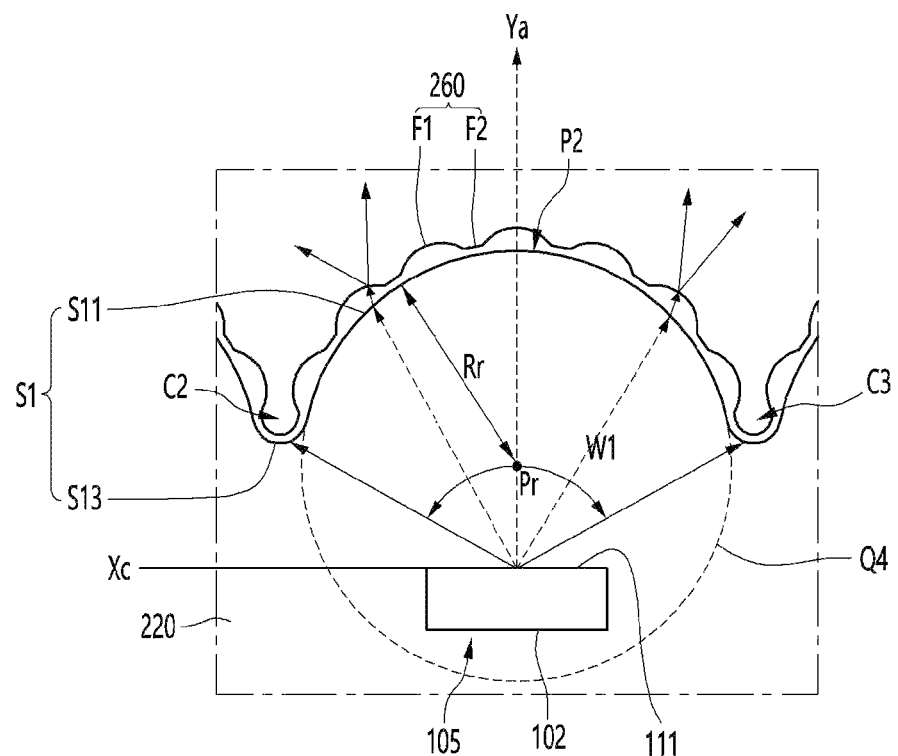
FIG. 7 is a view showing the detailed structure of the light extraction layer provided on the first surface of the resin layer in the lighting device of FIG. 2.

FIG. 1 is a perspective view showing a lighting device according to an embodiment of the invention, FIG. 2 is a plan view of the lighting device of FIG. 1, and FIG. 3 is a detailed structure of a light extraction layer provided on the first surface of the lighting device of FIG. 2, FIG. 4 is an example of a front view of the lighting device of FIG. 1, FIG. 5 is a cross-sectional view taken along a B-B side of the lighting device of FIG. 2, FIG. 6 is a cross-sectional view taken along a C-C side of the lighting device of FIG. 2, and FIG. 7 is a view showing the detailed structure of the light extraction layer provided on the first surface of the resin layer in the lighting device of FIG. 2.

Referring to FIGS. 1 to 7, a lighting device 200 according to an embodiment of the invention includes a light source having a plurality of light emitting devices 105, and irradiates the light emitted from the light emitting devices 105 as a line-shaped surface light. The light emitted from the light emitting device 105 may be emitted as light having a constant height in a vertical direction and a long length. The lighting device 200 includes a substrate 210, a light source having a light emitting device 105 disposed on the substrate 210, a resin layer 220 disposed on the substrate 210 and the light emitting device 105, and a second reflective layer 240 disposed on the resin layer 220. The lighting device 200 may include a first reflective layer 230 between the substrate 210 and the resin layer 220.

A plurality of the light emitting devices 105 may be arranged in the second direction X. The light emitting devices 105 may be arranged in one row. The plurality of light emitting devices 105 may be arranged on a straight line or a curved line extending in the second direction X. As another example, the light emitting device 105 may be arranged in two or more different columns. An interval G1 between adjacent light emitting devices 105 may be the same. The interval G1 may be greater than the thickness of the lighting device 200, for example, a vertical distance from a lower surface of the substrate 210 to an upper surface of the second reflective layer 240 (e.g., Z1). For example, when the vertical distance is Z1, the interval G1 may be three times or more of the Z1. The interval G1 may be 10 mm or more, for example, in a range of 10 mm to 20 mm. When the interval G1 is greater than the above range, the luminous intensity may be decreased, and when the interval G1 is smaller than the above range, a number of light emitting devices 105 may be increased.

Figure 10:
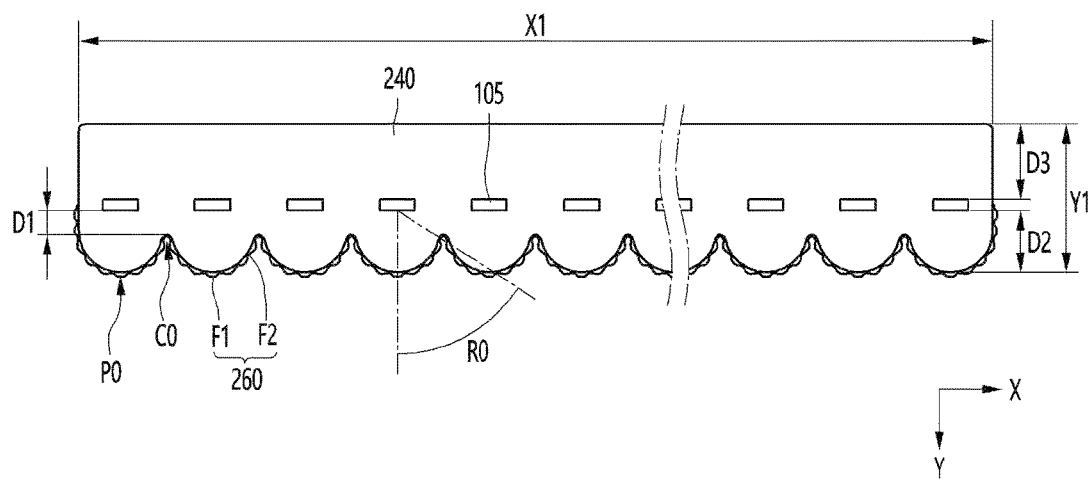
FIG. 10 is a diagram illustrating an example of light extraction in a lighting device according to an embodiment of the invention.

As shown in FIGS. 2, 6 and 10, in the lighting device 200, the maximum length X1 in the second direction X may be greater than the maximum length Y1 in the first direction Y. The lengths in the first and second directions Y and X may be greater than the thickness Z1 or the height in the vertical direction Z. The maximum length X1 in the second direction may vary depending on the number of arrangements of the light emitting devices 105, and may be, for example, 30 mm or more. The maximum length Y1 in the first direction may be 13 mm or more, for example, 13 mm to 25 mm. The maximum length Y1 in the first direction Y of the lighting device 200 may be provided taking into account a region in which the light emitted from the light emitting device 105 is diffused, a region protecting the rear of the light emitting device 105, and a pattern region. With respect to the maximum length Y1 in the first direction Y, the length on the third surface (e.g., S3) and the length on the fourth surface (e.g., S4) of the lighting device may be the same or different from each other. For example, the length of the fourth surface S4 in the first direction may be smaller than the length of the third surface S3. The lighting device 200 may be a flexible module or a rigid module. The lighting device 200 may be flat or curved in at least one of the first and second directions Y and X. The lighting device 200 may include both sides facing to each other in the first direction Y and both sides facing to each other in the second direction X. The light emitting device 105 may be disposed between the layers of the reflective material that face each other in the vertical direction, or may be disposed adjacent to any one layer in the region between the layers of the reflective material that face each other in the vertical direction. The light emitting device 105 may be disposed between a supporting member and a reflective member or layer that are vertically opposed to each other. The light emitting device 105 may emit light in at least one direction or may emit light in a plurality of directions. Each side of the lighting device 200 may have the same thickness or the same height as each other. The light emitting device 105 may be sealed by a layer of a transparent resin material, and the layer of the resin material may be disposed between layers of a reflective material or between a supporting member and a reflective layer or member.

As shown in FIGS. 1, 5 and 6, the lighting device 200 may include a substrate 210, a light emitting device 105 on the substrate 210, a resin layer 220 on the substrate 210 and the light emitting device 105, and a second reflective layer 240 disposed on the layer 220 and the resin layer 220. The lighting device 200 may include a first reflective layer 230 between the substrate 210 and the resin layer 220. The resin layer 220 may be disposed on the light emitting devices 105. The resin layer 220 may be disposed on each side of the light emitting device 105, between adjacent light emitting devices 105, or disposed on an upper portion of each of the light emitting devices 105.

The substrate 210 may include a printed circuit board (PCB), for example, a resin-based printed circuit board (PCB), a metal core PCB, a flexible PCB, a ceramic PCB, or a FR-4 substrate. The substrate 210 may be a flexible or non-flexible substrate. A circuit pattern may be disposed on the substrate 210. The circuit pattern of the substrate 210 may include a plurality of pads in a region corresponding to the light emitting device 105. The circuit pattern in the substrate 210 may be disposed on the upper portion, or may be disposed on the upper and lower portions. The resin layer 220 may be disposed on the substrate 210. The resin layer 220 may be disposed between the substrate 210 and the second reflective layer 240. The resin layer 220 may be disposed between the upper surface of the substrate 210 and the lower surface of the second reflective layer 240. The resin layer 220 may surround or embed the plurality of light emitting devices 105 disposed on the substrate 210. The resin layer 220 may be a light-transmitting layer. The resin layer 220 may include a glass material as another material. The plurality of light emitting devices 105 (101, 102, 103) may be arranged in n number (n≥2) in the first row or along the first line. Each outer surface of the lighting device 200 may be each side of the resin layer 220 having the thickest thickness in the lighting device 200. The outer surfaces S1, S2, S3, and S4 of the resin layer 220 may be disposed in a direction perpendicular to each side surface of the substrate 210, the first reflective layer 230, and the second reflective layer 240. The outer surfaces S1, S2, S3, and S4 of the resin layer 220 may be disposed on the same plane as side surfaces of the substrate 210, the first reflective layer 230, and the second reflective layer 240. The resin layer 220 may include a first surface S1 and a second surface S2 facing to each other in the first direction Y, a third surface S3 and a fourth surface S4 facing to each other in the second direction X. The first and second surfaces S1 and S2 may extend from both ends of the third and fourth surfaces S3 and S4 in the second direction X. The first surface S1 may face the second surface S2 and may include a curved surface. In the resin layer 220, a length in the second direction X of the first surface S1 and the second surface S2 may be greater than a height or thickness in a vertical direction. The maximum length in the second direction X of the first surface S1 and the second surface S2 may be the same or different from each other. The first surface S1 and the second surface S2 may have the same height or thickness in the vertical direction. The height or thickness of the third surface S3 and the fourth surface S4 in the vertical direction may be the same as the height or thickness of the first surface S1 and the second surface S2 in the vertical direction. In the resin layer 220, the first surface S1 and the second surface S2 may be side surfaces having a long length in the second direction X. The third surface S3 and the fourth surface S4 may be side surfaces having a long length in the first direction Y. The first surface S1 faces to the emission portion 111 of the light emitting device 105 or may be a surface exposed in the second direction X from the first ends of the third surface S3 and the fourth surface S4. The second surface S2 may be a surface that faces the rear surfaces of the plurality of light emitting devices 105 or exposed in the second direction X from the second ends of the third and fourth surfaces S3 and S4. The third and fourth surfaces S3 and S4 may be different from the first and second surfaces S1 and S2. The rear surface of the light emitting device 105 may be a surface opposite to the emission portion 111.

Each of the plurality of light emitting devices 105 may have the emission portion 111 facing to the first surface S1. The light emitted from the light emitting device 105 is emitted through the first surface S1, and some light may be emitted through at least one of the second surface S2, the third surface S3, and the fourth surface S4. That is, most of the light emitted from the light emitting device 105 may be emitted through the first surface S1. In the lighting device 200, the maximum lengths Y1 and X1 in the first and second directions may be the maximum lengths of the resin layer 220 in the first and second directions. Accordingly, the light source in the form of a line may be emitted through the first surface S1 of the resin layer 220.

The first surface S1 of the resin layer 220 may be an exit surface from which the light emitted from the light emitting device 105 is emitted. The first surface S1 may be a front surface or an exit surface, and the second surface S2 may be a rear surface or a non-exit surface. The first surface S1 is a surface from which light is emitted, and a surface with a vertical direction may extend along the second direction X. As another example, the first surface S1 may be a curved surface convex with respect to a vertical direction, an inclined structure protruding from an upper end to a lower end, or an inclined structure protruding from the lower end to the upper end. The first surface S1 may have a regular uneven shape or a side surface on which uneven structures are arranged. The first surface S1 may be a region having a greater surface area than that of the opposite second surface S2. The first surface S1 may include a plurality of exit surfaces S11 corresponding to each of the light emitting devices 101, 102, and 103, and a plurality of concave surfaces S13 respectively disposed between the plurality of exit surfaces S11. The resin layer 220 may include a plurality of convex portions P1, P2, and P3 that have an exit surface S11 and protrude from the first surface S1. The convex portions P1, P2, and P3 may have a convex exit surface S11 or a convex surface disposed in the direction of the first surface S1. In the resin layer 220, each of the concave surfaces S13 may be disposed in a region between the convex portions P1, P2, and P3 on the first surface S1. The concave surface S13 may be a concave surface or may include a flat surface. The resin layer 220 or the lighting device 200 may include recess portions C1 and C2 recessed in the direction of the second surface S2 in the region between the convex portions P1, P2, and P3. The recess portions C1 and C2 may overlap the region of the concave surface S13 in the second direction X. The recess portions C1 and C2 may be respectively disposed between the convex portions P1, P2 and P3. The recess portions C1 and C2 may be spaced apart from the third and fourth surfaces S3 and S4. The exit surface S11 and the concave surface S13 may be alternately disposed. The convex portions P1, P2, and P3 and the recess portions C1 and C2 may be alternately disposed. The surface disposed at the outermost side in the first direction on the first surface S1 may be the exit surface S11. The outermost exit surface S11 may extend from the third surface S3 or may extend from the fourth surface S4. A center of each of the plurality of exit surfaces S11 may be disposed at a position corresponding to a center of each of the plurality of light emitting devices 101, 102, and 103. Each of the plurality of light emitting devices 101, 102, and 103 may overlap each of the convex portions P1, P2, and P3 in the first direction Y. Each of the plurality of light emitting devices 101, 102, and 103 may overlap the exit surface S11 in the first direction and may not overlap the concave surface S13 in the first direction Y. Each of the plurality of light emitting devices 101, 102, and 103 may not overlap the recess portions C1 and C2 in the first direction Y. A height in the vertical direction of the exit surface S11 may be the same as a thickness in the vertical direction of the resin layer 220. A height in a vertical direction of the concave surface S13 may be the same as a thickness in a vertical direction of the resin layer 220.

The resin layer 220 may cover or mold the light emitting devices 101, 102, and 103. Each of the light emitting devices 101, 102, and 103 may include a light emitting chip. The light emitting devices 101, 102, and 103 may include a reflective sidewall surrounding an outside of the light emitting chip, for example, a body. The reflective sidewall may have a structure in which a region facing the first surface S1 of the resin layer 220 is opened and surrounds a periphery of the light emitting chip. The reflective sidewall may be a part of the light emitting devices 101, 102, and 103, or may be separately provided with a reflective material. Sides of the light emitting devices 101, 102, and 103 excluding the emission portion 111 may be formed of a reflective material or a transparent or opaque material.

Each of the light emitting devices 101, 102, and 103 may have a bonding portion disposed thereunder and may be electrically connected to a pad of the substrate 210. The light emitting devices 101, 102, and 103 may be connected in series by a circuit pattern of the substrate 210, or may be in series-parallel, parallel-series or parallel. As another example, the light emitting devices 101, 102, and 103 may be connected in various groups by circuit patterns of the substrate 210. The light emitting devices 101, 102, and 103 may include a device including a light emitting chip or a package in which an LED chip is packaged. The light emitting chip may emit at least one of blue, red, green, and ultraviolet (UV) light. The light emitting devices 101, 102, and 103 may emit at least one of white, blue, red, and green. The light emitting devices 101, 102, and 103 emit light in a lateral direction, and a lower portion may be disposed on the substrate 210. The light emitting devices 101, 102, and 103 may be a side view type package. As another example, the light emitting devices 101, 102, and 103 may be an LED chip, and one surface of the LED chip may be opened and a reflective member may be disposed on the other surface of the LED chip.

As shown in FIG. 2, the maximum distance D2 between the light emitting device 105 and the first surface S1 based on the light emitting device 105 may be different from the maximum distance D3 between the light emitting device 105 and the second surface S2. The distance D3 between the light emitting device 105 and the second surface S2 may be 2 mm or more, for example, may be in the range of 2 mm to 20 mm. When the distance D3 between the light emitting device 105 and the second surface S2 is smaller than the above range, the region through which moisture may penetrate or form a circuit pattern may be reduced, and when it is larger than the above range, a size of the lighting device 200 may be increased. The maximum distance D2 may be a maximum distance between the exit surface S11 and the light emitting device 105 or a linear distance between the light emitting device 105 and the vertices of the convex portions P1, P2, and P3. The maximum distance D2 may be 5 mm or more, for example, in the range of 5 mm to 20 mm or in the range of 8 mm to 20 mm. When the maximum distance D2 is smaller than the above range, a hot spot may be generated, and when it is larger than the above range, the module size may be increased. The distance D1 between the straight line connecting the concave surfaces S13 and each of the light emitting devices 101, 102, and 103 may be 5 mm or more, for example, in a range of 5 mm to 12 mm, and when the distance D1 is smaller than the above range, a depth D4 of the recess portions C1 and C2 may be increased or the maximum distance D2 may be decreased, so that dark portions may be generated in the recess portions C1 and C2. The distance D1 may vary depending on the light beam angle of each of the light emitting devices 101, 102, and 103. That is, when the distance between the straight lines connecting both ends of the convex portions P1, P2, and P3 and each of the light emitting devices 101, 102, and 103 is too close, the light may be condensed to the center region of the exit surface S11, when it is far away, light may be irradiated to the concave surface S13, so that the luminous intensity through the exit surface S11 may be reduced. The maximum length W1 of the convex portions P1, P2, and P3 in the first direction is the distance between the adjacent recess portions C1 and C2, and is equal to or smaller than the interval G1 between the light emitting devices 105. When the maximum length W1 of the convex portions P1, P2, and P3 is greater than the interval G1 between the light emitting devices 105, two or more light emitting devices 105 are located in the region on the convex portions P1, P2, and P3 to increase the luminous intensity, but there may be difficulties in controlling the light distribution. When the maximum length W1 of the convex portions P1, P2, and P3 is smaller than the interval G1 between the light emitting devices 105, the size of the convex portions P1, P2, and P3 is small, thereby providing a uniform distribution of light, but the luminance intensity may be reduced. The maximum length W1 of the convex portions P1, P2, and P3 may be 15 mm or more, for example, in a range of 15 mm to 20 mm. The maximum length W1 of the convex portions P1, P2, and P3 may be greater than the depth D4 of the recess portions C1 and C2. A ratio of the maximum length W1 of the convex portions P1, P2, and P3 to the depth D4 of the recess portions C1 and C2 may be in the range of 1:0.4 to 1:0.7. When the depths of the recess portions C1 and C2 are smaller than the above range, a dark region between the adjacent convex portions P1, P2 and P3 may be increased. When the depths of the recess portions C1 and C2 are greater than the above range, the depth of the recess portions C1 and C2 may extend to a region adjacent to the light emitting device 105, thereby increasing optical interference between the light emitting devices 105. The depth D4 of the recess portions C1 and C2 may be a straight-line distance between the troughs of the recess portions C1 and C2 from a straight line connecting the vertices of the convex portions P1, P2, and P3.

As shown in FIGS. 3 to 6, the resin layer 220 and the light emitting device 105 may be disposed on the substrate 210. The first reflective layer 230 may be disposed between the resin layer 220 and the substrate 210. The resin layer 220 may be in contact with upper surface and side surfaces of each of the light emitting devices 101, 102, and 103. The resin layer 220 may be in contact with an upper surface of the first reflective layer 230. A portion of the resin layer 220 may be in contact with the substrate 210 through a hole in the first reflective layer 230. The resin layer 220 may be in contact with the emission portion 111 of each of the light emitting devices 101, 102, and 103. The first surface S1, the second surface S2, the third surface S3, and the fourth surface S4 of the resin layer 220 are outer surfaces between the first and second reflective layers 230 and 240. An upper surface of the resin layer 220 may be in contact with the second reflective layer 240, and a lower surface of the resin layer 220 may be in contact with the first reflective layer 230. The upper and lower surfaces of the resin layer 220 may be a horizontal plane or a surface having a curvature. When there is no the first reflective layer 230, the lower surface of the resin layer 220 may be in contact with the substrate 210. The area of the lower surface of the resin layer 220 may be the same as the area of the upper surface of the substrate 210. The area of the lower surface of the resin layer 220 may be the same as the area of the upper surface of the first reflective layer 230. An area of the upper surface of the resin layer 220 may be the same as an area of an upper surface of the second reflective layer 240. The length of the resin layer 220 in the second direction X may be the same as the length (e.g., X1) of the substrate 210. The maximum length of the resin layer 220 in the second direction X may be the same as the maximum length of the first reflective layer 230 or the second reflective layer 240. The maximum length (e.g., Y1) of the resin layer 220 in the first direction Y may be the same as a maximum length of the substrate 210. The maximum length (e.g., Y1) of the resin layer 220 in the first direction Y may be the same as the maximum length of the first reflective layer 230. The maximum length (e.g., Y1) of the resin layer 220 in the first direction Y may be the same as the maximum length of the second reflective layer 240. The minimum length of the resin layer 220 in the first direction Y may be the same as the minimum length of the substrate 210. The minimum length of the resin layer 220 in the first direction Y may be the same as the minimum length of the first reflective layer 230 or the second reflective layer 240. The maximum length Y1 in the first direction Y may be a length between the vertices or peaks of the convex portions P1, P2, and P3 of the lighting device and the second surface S2, and the minimum length may be a length between a point of the concave surface S13 of the lighting device and the second surface S2. The resin layer 220 may be disposed between the first and second reflective layers 230 and 240. The first and second reflective layers 230 and 240 may have the same area as each other and face the upper and lower surfaces of the resin layer 220. Accordingly, the resin layer 220 may diffuse the light emitted from the light emitting device 105 and the light reflected by the first and second reflective layers 230 and 240 to guide and emit the light in the direction of the first surface S1.

As shown in FIG. 5, the resin layer 220 may have a thickness Zb greater than that of the light emitting device 105. Here, the thickness of the light emitting device 105 is a length in a vertical direction of the light emitting device 105 and may be smaller than a length in the first direction Y. The thickness of the light emitting device 105 may be 3 mm or less, for example, 2 mm or less. The thickness of the light emitting device 105 may be in the range of 1 mm to 2 mm, for example, in the range of 1.2 mm to 1.8 mm. A portion of the resin layer 220 may be disposed between each of the light emitting devices 101, 102, and 103 and the second reflective layer 240. Accordingly, the resin layer 220 may protect the upper portions of each of the light emitting devices 101, 102, and 103 and prevent moisture penetration. Since the substrate 210 is disposed on the lower portion of the light emitting device 105 and the resin layer 220 is disposed on the upper portion of the light emitting device 105, each of the light emitting devices 101, 102, and 103 may be protected. Accordingly, the interval between the upper surface of the resin layer 220 and the upper surface of each of the light emitting devices 101, 102, 103 may be 0.6 mm or less, for example, in the range of 0.5 mm to 0.6 mm. An upper portion of the resin layer 220 may extend over each of the light emitting devices 101, 102, and 103 to protect the upper portions of the light emitting devices 101, 102, and 103. As shown in FIGS. 2 and 3, the convex surface or the exit surface S11 of the convex portions P1, P2, and P3 may have a first curvature. The concave surface S13 may be flat or have a greater curvature than the first curvature. Here, the radius of curvature of the convex portions P1, P2, and P3 may be in the range of 7.5 mm or more, for example, in the range of 7.5 mm to 14 mm or in the range of 8 mm to 11 mm. When the radius of curvature of each of the convex portions P1, P2, and P3 is smaller than the above range, the improvement in luminous intensity is insignificant. When the concave surface S13 has a curvature, the radius of curvature of the concave surface S13 may be less than 0.12 times smaller than the radius of curvature of the convex portions P1, P2, and P3. A ratio of the radius of curvature of the concave surface S13 to the radius of curvature of the convex portions P1, P2, and P3 may be in the range of 1:8 to 1:28. When the radius of curvature of the concave surface S13 is smaller than the above range, the amount of light emitted through the concave surface S13 is reduced to increase the dark portion. When the radius of curvature of the concave surface S13 is smaller than the above range, the amount of light emitted through the concave surface S13 may be reduced and the dark portion may be increased, when it is greater than the above range, a size of the convex portions P1, P2 and P3 may be reduced and a light interference between the light emitting devices 105 may occur. Accordingly, the depth D4 and the radius of curvature of the concave surface S13 may consider a position of the light emitting device 105 and an angle of beam spread of the light emitting device 105, and may be a range for improving light uniformity through the convex portions P1, P2, and P3 and the recess portions C1 and C2 and suppressing dark portions on the recess portions C1 and C2. The radius of curvature of the concave surface S13 may be in the range of 0.5 to 1 mm. Since the concave surface S13 has a predetermined curvature and is provided in a curved shape, it is possible to refract and transmit incident light, thereby reducing the occurrence of dark portions on the recess portions C1 and C2.

As shown in FIG. 5, the thickness Zb of the resin layer 220 may be a distance between the upper and lower surfaces of the resin layer 220. The thickness Zb of the resin layer 220 may be a vertical distance between the first and second reflective layers 230 and 240. The thickness Zb may be equal to the distance between the first and second reflective layers 230 and 240. The thickness Zb may be smaller than a distance between the first surface S1 and the second surface S2. For example, a distance between the first surface S1 and the second surface S2 may include the maximum length Y1 and the minimum length. The maximum length Y1 in the first direction Y may be a linear distance between the apex of the convex portion P1 and the second surface S2. A distance or an interval between the third and fourth surfaces S3 and S4 of the resin layer 220 may be greater than a distance between a peak of the convex portion P1 and the second surface S2. The minimum length in the first direction Y may be a linear distance between the concave surface S13 and the second surface S2. The distance or interval between the first reflective layer 230 and the second reflective layer 240 may be smaller than the distance or interval between the first surface S1 and the second surface S2 of the resin layer 220. Since the distance between the first and second reflective layers 230 and 240 may have smaller than the length or minimum width in the first direction Y of the lighting device 200, the surface light source in the form of a line may provide through the first direction Y, it may improve a luminous intensity and prevent hot spots. In addition, the lighting device may have a constant thickness and may be provided with a flexible characteristic that may be convex or concave in the third direction Z. The thickness Zb of the resin layer 220 may be less than twice the thickness of the light emitting device 105, for example, more than 1 to 2 times or less than the thickness of the light emitting device 105. The thickness Zb of the resin layer 220 may be 2 mm or less, for example, in the range of 1.5 mm to 1.9 mm or in the range of 1.6 mm to 1.8 mm. The thickness Zb of the resin layer 220 may be 0.8 times or less of the thickness Z1 of the lighting device 200, for example, in a range of 0.4 times to 0.8 times the thickness Z1 of the lighting device 200. Since a thickness of the resin layer 220 may have a difference of 1.2 mm or less from the thickness Z1 of the lighting device 200, a decreased in a light efficiency in the lighting device 200 may be prevented and ductility characteristics may be enhanced. The thickness Zb of the resin layer 220 may be smaller than a length or a maximum length in the second direction X of each of the light emitting devices 101, 102, and 103. The thickness Zb of the resin layer 220 may be smaller than the maximum length W1 of the exit surface S11 in the second direction X. That is, by providing the thickness Zb of the slim resin layer 220, a line-shaped surface light source may be provided through the first surface S1 in one direction. The resin layer 220 may include a resin material such as silicone, silicone molding compound (SMC), epoxy, or epoxy molding compound (EMC). The resin layer 220 may include a UV (ultra violet) curable resin or a thermosetting resin material, for example, may selectively include PC, OPS, PMMA, PVC, and the like. For example, the main material of the resin layer 220 may be used of a resin material having a urethane acrylate oligomer as a main material. For example, a mixture of urethane acrylate oligomer, which is a synthetic oligomer, and a polymer type, which is polyacrylic. Of course, there may further include a mixed monomer with low-boiling dilution-type reactive monomer IBOA (isobornyl acrylate), HPA (Hydroxylpropyl acrylate, 2-HEA (2-hydroxyethyl acrylate), etc., and may be mixed a photoinitiator (for example, 1-hydroxycyclohexyl phenyl-ketone, etc.) or antioxidants as an additive.

A bead (not shown) may be included in the resin layer 220, and the bead may diffuse and reflect incident light, thereby increasing the amount of light. The resin layer 220 may include a phosphor. The phosphor may include at least one of yellow, green, blue, and red phosphors. In the resin layer 220, the region in which the convex portions P1, P2, and P3 are formed may serve as a lens portion. The lens portion of the resin layer 220 is provided in a lens shape having a convex convex surface, and may include a hemispherical shape, a semicircular shape, a semi-elliptical shape, or an aspherical shape when viewed from a top view. The lens may include a collimator lens. The closer the lens portion is to the peak corresponding to the center of the light emitting device 105, the further the distance between the lens portion and the light emitting device 105. The thickness of the lens portion in the third direction Z may be the thickness of the resin layer 220. Since the lens portion has flat upper and lower surfaces and has a curved surface in a direction if the first surface S1, it is possible to diffuse light incident in a direction of the first surface S1. The lens portion may be disposed between the first and second flat reflective layers 230 and 240 on the upper and lower portions thereof, and may refract light to the first surface S1 and emit the light. The lens portion may refract light incident to a region deviating from the optical axis with respect to the optical axis at an exit angle greater than an incidence angle. When the lighting device 200 has a curve due to its ductility, the resin layer 220 and the first and second reflective layers 230 and 240 may include curved regions instead of being flat. Each of the exit surfaces S11 of the resin layer 220 may emit light emitted from each of the respective light emitting devices 101, 102, and 103. In the resin layer 220, the recess portions C1 and C2 disposed between the convex portions P1, P2 and P3 may be provided as recess portions in the direction of the second surface S2. The recess portions C1 and C2 of the resin layer 220 may be formed on the concave surface S13 of the resin layer 220. Since the light emitted from each of the light emitting devices 101, 102 and 103 is emitted from the region between the convex portions P1, P2, and P3 through the recess portions C1 and C2, it is possible to reduce the occurrence of dark portions on the recess portions C1 and C2. Here, when the convex portions P1, P2, and P3 and the recess portions C1 and C2 are disposed on the resin layer 220, one side direction of each of the substrate 210 and the first and second reflective layers 230 and 240 may be provided in a shape corresponding to the convex portions P1, P2, and P3 and the recess portions C1 and C2. The number of the convex portions P1, P2, and P3 or the lens portions of the resin layer 220 may be the same as the number of each of the light emitting devices 101, 102, and 103.

As shown in FIGS. 5 and 6, the first reflective layer 230 may reflect the light emitted from the light emitting device 105. The first reflective layer 230 may be formed as an upper layer of the substrate 210 or as a separate layer. The first reflective layer 230 may be adhered to the upper surface of the substrate 210 with an adhesive. The resin layer 220 may be adhered to the upper surface of the first reflective layer 230. The first reflective layer 230 has a plurality of holes 232 in a region corresponding to the lower surface of the light emitting device 105, and the light emitting device 105 may be connected to the substrate 210 through the holes 232. A portion of the resin layer 220 may be in contact with the substrate 210 through the hole 232. The hole 232 may be a region in which the light emitting device 105 is bonded to the substrate 210. The first reflective layer 230 may have a single-layer or multi-layer structure. The first reflective layer 230 may include a material that reflects light, for example, a metal or a non-metal material. When the first reflective layer 230 is a metal, it may include a metal layer such as stainless steel, aluminum (Al), or silver (Ag), and in the case of a non-metal, it may include a white resin material or a plastic material. The first reflective layer 230 may include a white resin material or a polyester (PET) material. The first reflective layer 230 may include at least one of a low reflection film, a high reflection film, a diffuse reflection film, and a regular reflection film. The first reflective layer 230 may be provided, for example, as a specular reflective film for reflecting incident light to the first surface S1.

As shown in FIG. 4, the thickness Zc of the first reflective layer 230 may be smaller than the thickness Za of the substrate 210. The thickness Zc of the first reflective layer 230 may be 0.5 times or more and less than 1 times the thickness Za of the substrate 210 to reduce transmission loss of incident light. The thickness Zc of the first reflective layer 230 may be in the range of 0.2 mm to 0.4 mm, and when it is smaller than the above range, light transmission loss may occur, and when it is thicker than the above range, the thickness Zc of the lighting device 200 may increase. The second reflective layer 240 may be disposed on an entire upper surface of the resin layer 220 to reduce light loss. The second reflective layer 240 may be made of the same material as the first reflective layer 230. In order to reflect light and reduce transmission loss of light, the second reflective layer 240 may be made of a material having a higher light reflectance than that of the first reflective layer 230 or may have a thicker thickness. The second reflective layer 240 may have a thickness equal to or greater than the thickness Zc of the first reflective layer 230. For example, the first and second reflective layers 230 and 240 may be provided with the same material and the same thickness. The thickness Zd of the second reflective layer 240 may be equal to or smaller than the thickness Za of the substrate 210. The thickness Zd of the second reflective layer 240 is at least 0.5 times the thickness Za of the substrate 210, for example, in the range of 0.5 times to 1 time to reduce transmission loss of incident light. The thickness Zd of the second reflective layer 240 may be in the range of 0.2 mm to 0.4 mm, and when it is smaller than the above range, light transmission loss may occur, and when it is thicker than the above range, the thickness Z1 of the lighting device 200 may increase. The second reflective layer 240 may be formed in a single-layer or multi-layer structure. The second reflective layer 240 may include a material that reflects light, for example, a metal or a non-metal material. When the second reflective layer 240 is a metal, it may include a metal layer such as stainless steel, aluminum (Al), or silver (Ag), and in the case of a non-metallic material, it may include a white resin material or a plastic material. The second reflective layer 240 may include a white resin material or a polyester (PET) material. The second reflective layer 240 may include at least one of a low reflection film, a high reflection film, a diffuse reflection film, and a regular reflection film. The second reflective layer 240 may be provided as a specular reflective film so that, for example, incident light travels in the direction of the first surface S1. The first and second reflective layers 230 and 240 may be made of the same material or different materials. The stacked structure of the substrate 210, the first reflective layer 230, the resin layer 220, and the second reflective layer 240 may include a structure of the convex portions P1, P2, and P3 and the recess portions C1 and C2 in one direction. The convex portions P1, P2, and P3 have flat upper and lower surfaces, and may include a curved or hemispherical shape in the first direction Y. The recess portions C1 and C2 may include a flat or concave curved surface in the direction of the second surface S2. At least one or both of the exit surface S11 and the concave surface S13 of the resin layer 220 may be treated as a haze surface, thereby diffusing light. The haze surface may be formed as a surface rougher than the inner surface of the resin layer 220 to diffuse the emitted light.

The lighting device 200 according to an embodiment of the invention may provide the thickness Z1 in the third direction Z in the form of a line, thereby providing a surface light source in the form of the line and having ductility. The thickness Z1 of the lighting device 200 may be 3 mm or less, for example, 3 mm or less, or may be in the range of 2.4 mm to 3 mm. That is, the lighting device 200 may be provided as a line-shaped surface light source of 3 mm or less. As another example, the lighting device 200 may be arranged in a range of 2 mm to 6 mm, in which case, the thickness of the lighting device 200 is increased, but since the thickness of the resin layer 220 is increased, the line width may be increased and the light distribution region may increase.

Figure 9:
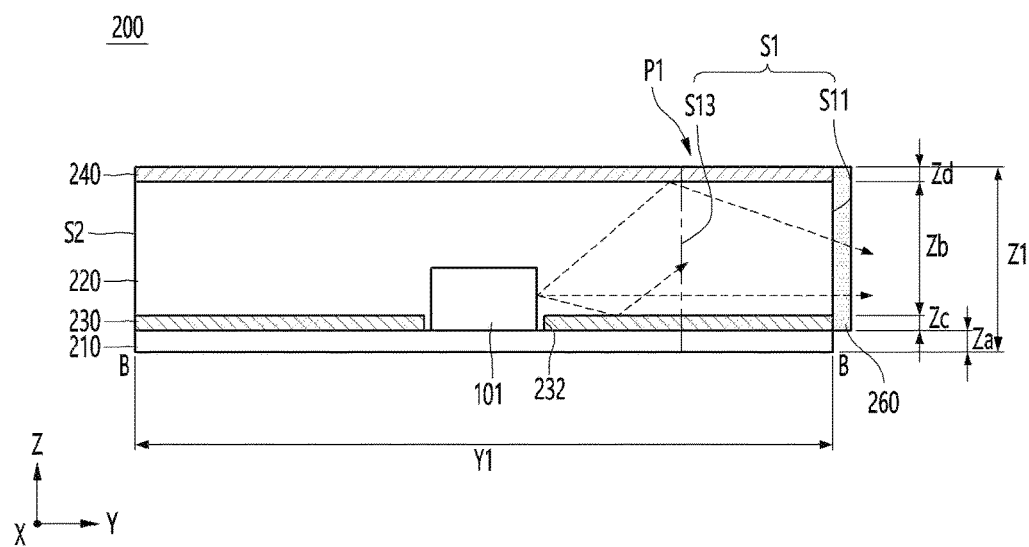
FIG. 9 is another example of the lighting device of FIG. 5.

As shown in FIGS. 1 to 3, the lighting device 200 according to an embodiment of the invention may include a light extraction layer 260 disposed on the first surface S1. The light extraction layer 260 may be disposed on the first surface S1 of the resin layer 220. The light extraction layer 260 may extend from the side surface of the substrate 210 to the side surface of the second reflective layer 240 on the first surface S1. As another example, as shown in FIG. 9, the light extraction layer 260 may extend from the side surface of the first reflective layer 230 to the side surface of the second reflective layer 240 on the first surface S1. The vertical height of the light extraction layer 260 may be a height (e.g., Z1) from the lower surface of the substrate 210 to the upper surface of the second reflective layer 240, or a height from the lower surface of the first reflective layer 230 to the upper surface of the second reflective layer 240. The light extraction layer 260 may be attached or adhered to the first surface S1 of the resin layer 220. The light extraction layer 260 may be attached to or adhered to at least one of side surfaces of the substrate 210 and side surfaces of the first and second reflective layers 230 and 240. An adhesive layer (not shown) may be disposed between the inner surfaces of the light extraction layer 260 and the first surface S1. The adhesive layer may include a transparent resin material such as silicone or epoxy. The light extraction layer 260 is a light-transmitting member, and may be a diffusion layer or an optical layer. The material of the light extraction layer 260 may include a synthetic resin or a photocurable resin, for example, polyesters, epoxy-based resins, polyester (meth) acrylate, epoxy (meth) acrylate, urethane (meth)acrylate-based resins such as acrylates; and mixtures thereof. In addition, the light extraction layer 260 may be, for example, a material of polyethyleneterephthalate (PET), polytrimethyleneterephtalate (PTT), polybutyleneterephthalate (PBT), polyethylene naphthalate (PEN), polytrimethylene naphthalate (PTN), polybutylene naphthalate (PBN), polycyclohexadimethylene terephthalate (PCT), polycyclohexadimethylene naphthalate (PCN), polycyclohexadimethylene cyclohexadimethylcarboxylate (PCC), and the like. Among these, PET, PEN, PCT, and PCN are preferable, and in particular, any one of PTN, PET, and PEN can be used. The refractive index of the material of the light extraction layer 260 may be less than or equal to 1.5, for example, in the range of 1.41 to 1.59, thereby preventing a decrease in luminance. The light extraction layer 260 may be disposed along the first surface S1 of the resin layer 220 to improve the luminance of the light emitted through the exit surface S11 of the first surface S1. The light extraction layer 260 may have a concave-convex pattern or a prism pattern on the outer surface to diffuse the incident light, thereby improving the uniformity of the light. The light extraction layer 260 may be disposed along the exit surface S11 and the concave surface S13 of the resin layer 220.

Figure 8:
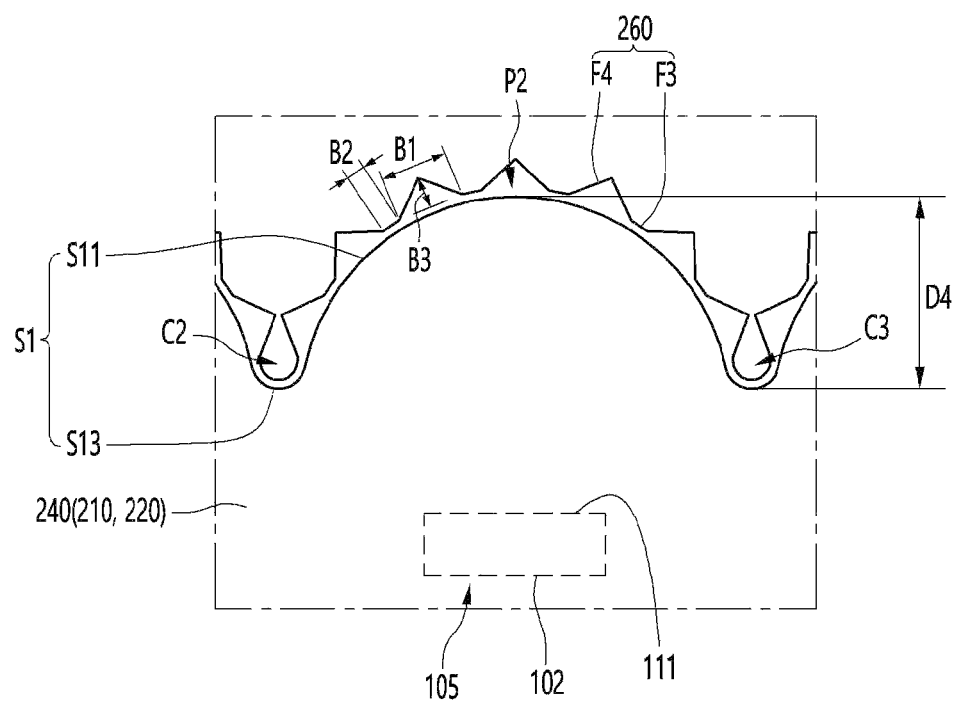
FIG. 8 is a view showing another example of the light extraction layer disclosed in FIGS. 1 to 7.

The light extraction layer 260 includes a first extraction portion F1 and a second extraction portion F2 disposed in one direction, and the first extraction portion F1 includes a plurality of protrusions, and the second extraction portion F2 may include a plurality of grooves respectively disposed between the protrusions. The first extraction portion F1 may protrude from a body or base portion of the light extraction layer 260, and the second extraction portion F2 may have an outer surface of the light extraction layer 260. The grooves may be respectively disposed between the plurality of protrusions. The protrusions and grooves may be alternately disposed, and a distance between the protrusions may be constant. For example, the distance between the protrusions on the exit surface may be constant. The inner surface of the light extraction layer 260 may include a first region having a convex curvature along the exit surface S11 and a second region having a concave or flat surface along the concave surface S13. The first region may be a surface corresponding to the outer surface of the exit surface S11 or the convex portions P1, P2, and P3, and the second region may be a region corresponding to the concave surface S13. The first extraction portion F1 may have a hemispherical side cross-sectional shape. An outer surface of the first extraction portion F1 may be a convex curved surface. As another example, as shown in FIG. 8, the first extraction portion F1 may have a triangular shape. The second extraction portion F2 may be an outer surface connecting between the protrusions. The surface of the second extraction portion F2 may include a curved surface.

As shown in FIG. 1, the height of the first extraction portion F1, that is, the length in the third direction Z may be greater than the thickness (e.g., Zb) of the resin layer 220, and the first extraction portion F1 may extend from a side surface of the substrate 210 to a side surface of the second reflective layer 240. The height of the first extraction portion F1 in the third direction Z may be the same as the height of the light extraction layer 260. As shown in FIGS. 3 and 5, the maximum width B1 of the first extraction portion F1 may be greater than the thickness B3 of the first extraction portion F1. The maximum width B1 of the first extraction portion F1 may be a width of a lower end of the protrusion, and may be 50 micrometers or more, for example, in a range of 50 to 150 micrometers. The thickness B3 of the first extraction portion F1 may be the maximum thickness of the protrusion, and may be the maximum length protruding in the first direction Y. The maximum thickness B3 of the first extraction portion F1 may be 20 micrometers or more, for example, in the range of 20 to 50 micrometers. The maximum width B1 of the first extraction portion F1 may be two times or more than the maximum thickness B3, for example, in a range of 2 times to 4 times the maximum thickness B3. The width B2 of the second extraction portion F2 may be equal to or smaller than the thickness B3 of the first extraction portion F1, and may be 15 micrometers or more, for example, in a range of 15 to 30 micrometers. A maximum width of the first extraction portion F1 may be smaller than a vertical height.

When the maximum width B1 of the first extraction portion F1 is smaller than the above range, the amount of incident light may be reduced or the light uniformity may be lowered, and when it is greater than the above range, the adhesive force with the curved surface of the exit surface S11 may be lowered or the light loss may be increased. The thickness B3 of the first extraction portion F1 may consider refraction of light or guiding efficiency of light, when it is smaller than the above range, diffusion efficiency may be lowered, and when it is larger than the above range, light uniformity may be lowered. Five or more convex protrusions may be disposed along the exit surface S11 in the first extraction portion F1 to diffuse the light incident through the exit surface S11. Two or more protrusions of the first extraction portion F1 may correspond to each of the light emitting devices 101, 102, and 103. Accordingly, the uniformity of the light emitted through the light extraction layer 260 may be improved. In this case, the dark portion that may be generated on the recess portions C1 and C2 may be improved by the light extraction layer 260. The maximum thickness of the light extraction layer 260 may be smaller than the maximum width B1 of the first extraction portion F1. Since the light extraction layer 260 is provided with a thickness that does not deteriorate the ductility characteristics, it is closely adhered along the first surface S1 of the resin layer 220, that is, the exit surface S11 and the concave surface S13 to prevent the problem of separation from the first surface S1. Here, the concave surface S13 may have the first extraction portion F1 or the second extraction portion F2 disposed therein, but is not limited thereto.

As shown in FIG. 2, a first end Fa of the light extraction layer 260 may be adhered to the third surface S3, and the second end Fb may be disposed on the fourth surface S4. The first end Fa of the light extraction layer 260 may be overlapped with the first light emitting device 101 located first in the second direction X. The second end Fb of the light extraction layer 260 may overlap the third light emitting device 103 located last in the second direction X. Since the first and second ends Fa and Fb of the light extraction layer 260 overlap the light emitting device 105 in the second direction X, a loss of the light emitted from the light emitting device 105 having a distribution of a predetermined angle of beam spread may reduce. The first and second ends Fa and Fb of the light extraction layer 260 may extend in the direction of the second side surface S2 rather than the straight line Xc passing through the emission portion 111 of the light emitting device 105. Accordingly, light loss due to the light extraction layer 260 on the third and fourth surfaces S3 and S4 of the resin layer 220 may be reduced. Since the first and second ends Fa and Fb of the light extraction layer 260 are disposed closer to imaginary straight line Xc connecting the emission portions 111 of the light emitting device 105 rather than an imaginary straight line Xb connecting the plurality of concave surfaces S13, it is possible to reduce the loss of light progressing in the direction of the third and fourth surfaces S3 and S4 of the resin layer 220. According to an embodiment of the invention, the imaginary straight line Xb extending the plurality of concave surfaces S13 may be disposed on a horizontal straight line or may be disposed in the form of an inclined oblique line. The imaginary straight line Xa connecting the plurality of exit surfaces S11 may be disposed on a horizontal straight line or may be disposed in the form of an inclined oblique line. In this case, the distance (e.g., D4) between the two straight lines Xa and Xb may be the same or may decrease toward the fourth surface.

As shown in FIGS. 1 and 7, a shape of the convex portions P1, P2, and P3 or the exit surface S11 of the resin layer 220 may include a hemispherical shape, a semicircular shape, a semi-elliptical shape, or an aspherical shape. Here, a portion of the light emitting device 105 may disposed in a virtual circle Q4 passing at least two of the center points among a center point and points in contact with the concave surface S13 along the convex portions P1, P2, and P3 or the exit surface S11. The central axis Ya passing through the center Pr of the virtual circle Q4 and the center of the light emitting device 105 may be vertical or 90 degrees with respect to the imaginary straight line Xc passing through the emission portion 111 of the light emitting device 105. In this case, the central axes on the different convex portions P1, P2, and P3 may be parallel to each other. The angle W1 between the points in contact with the two adjacent concave surfaces S13 with respect to the center of the light emitting device 105 may consider the angel of beam spread, and may range from, for example, in a range of 115 to 135 degrees. When the convex portions P1, P2, and P3 and the exit surface S11 have a hemispherical shape, the distance Rr from the exit surface S11 based on the center Pr of the virtual circle may be contacted with a curved surface along the radius of curvature.

Figure 11:
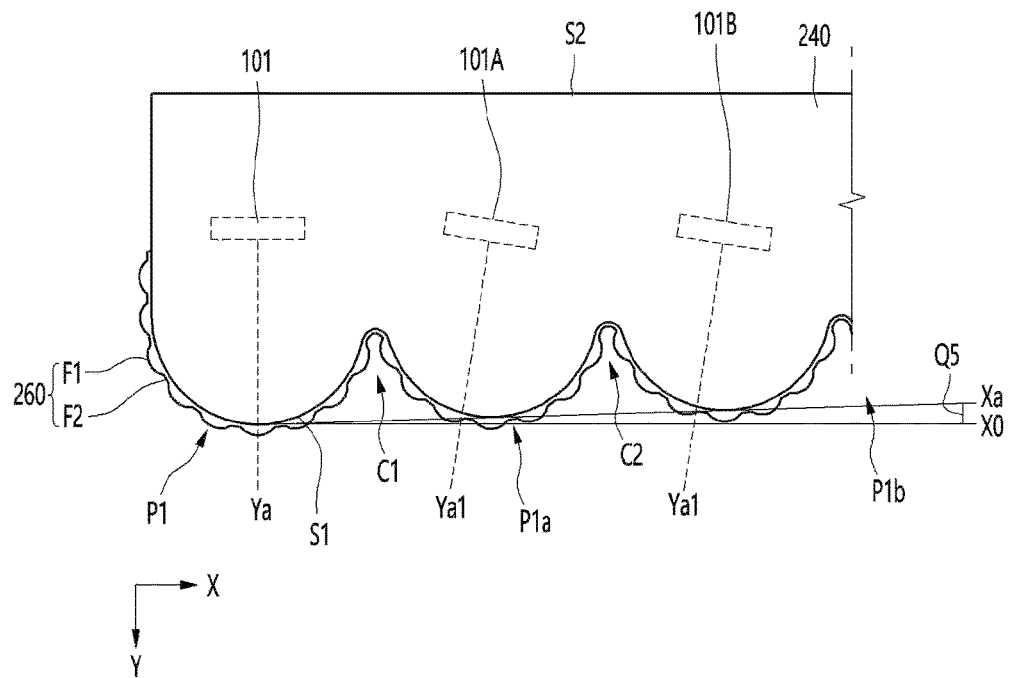
FIG. 11 is a modified example of a lighting device according to an embodiment of the invention.

Here, as shown in FIGS. 7 and 11, when light is irradiated toward a target in which the angle between Ya and Xc has the same focal length disposed on the plurality of convex portions P1, P2, and P3, the different light emitting devices 101, 101A, and 101B or the different central axes Yb may be shifted or tilted according to the target direction. Accordingly, in any of the convex portions P1, P2, and P3, the angle between Ya and Xc may be greater than or equal to 90 degrees, for example, in the range of 90 to 150 degrees. That is, the central axes Ya, Ya1, and Ya2 passing through the center of each light emitting device 101, 102, and 103 and the center of the virtual circle may extend to converge to a certain point (target). That is, the central axes Ya, Ya1, and Ya2 on the different convex portions P1, P1a, and P1b may not be parallel to each other.

At this time, the imaginary straight line Xa passing through the adjacent convex portions P1, P1a, and P1b or the exit surfaces S1 may be inclined at a predetermined angle Q5 from the horizontal straight line X0. The angle Q5 may be greater than or equal to 0.1 degrees, may vary depending on the number of light emitting devices, and may be at most 60 degrees or less.

Referring to FIGS. 8 and 5, in the light extraction layer 260, the first extraction portion F3 may have a triangular cross-sectional shape. The outer surface of the first extraction portion F3 has a structure having a prism pattern, and may have a shape in which a vertex portion is an angled surface or a vertex is a curved surface. The second extraction portion F4 is an outer surface connecting between the protrusions, and may include a curved surface. The height of the first extraction portion F3 in the third direction Z may be greater than the thickness Zb of the resin layer 220 (see FIG. 5), and may be extended from the side of the substrate 210 to the side of the second reflective layer 240. The height of the first extraction portion F3 in the third direction Z may be the same as the height of the light extraction layer 260. The maximum width B1 of the first extraction portion F3 may be equal to or smaller than the maximum thickness B3 of the first extraction portion F3. The maximum width B1 of the first extraction portion F3 is the width of the lower end of the protrusion, and may be in the range of 4 micrometers or more, for example, in a range of 4 to 15 micrometers. The thickness B3 of the first extraction portion F3 is the maximum thickness of the protrusion, and may be the maximum length protruding in the first direction. The thickness B3 of the first extraction portion F3 may be 4 micrometers or more, for example, in the range of 4 to 20 micrometers. The width B2 of the second extraction portion F4 may be equal to or smaller than the thickness B3 of the first extraction portion F3, and may be 4 micrometers or more, for example, in the range of 4 to 10 micrometers. When the maximum width of the first extraction portion F3 is smaller than the above range, the amount of incident light may be reduced or the light uniformity may be reduced, and when it is larger than the above range, the adhesion force with the curved surface of the exit surface S11 may be reduced or light loss may be increased. The thickness B3 of the first extraction portion F3 may take into account the refraction of light or the guiding efficiency of light due to the prism pattern shape. When it is smaller than the above range, the diffusion efficiency may decrease, and when it is larger than the above range, the light uniformity may decrease. The maximum width of the first extraction portion F3 may be smaller than the height in the vertical direction. Five or more convex protrusions may be disposed along the exit surface S11 in the first extraction portion F3 to diffuse the light incident through the exit surface S11. Two or more protrusions of the first extraction portion F3 may correspond to each of the light emitting devices 101, 102, and 103. Accordingly, the uniformity of the light emitted through the light extraction layer 260 may be improved. In this case, the dark portion that may be generated on the recess portions C1 and C2 may be improved by the light extraction layer 260.

Referring to FIG. 10, an angle RO between the center of the light emitting device 105 and a lower point of the recess portion C0 based on a straight line passing through the center of the light emitting device 105 and the center of the convex portion P0 may be greater than or equal to 50 degrees, for example, in the range of 50 to 80 degrees. The recess portion C0 are spaced apart at the above angle RO, so that light is received from the light emitting device 105, refracted, and emitted to the outside. The convex portion P0 and the recess portion C0 may include the convex portions P1, P2, and P3 and the recess portions C1 and C2 shown in FIGS. 1 to 9.

Figure 12:
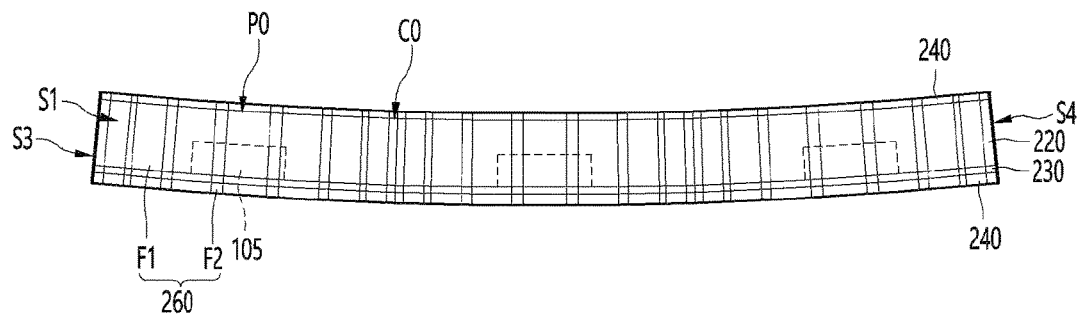
FIGS. 12 and 13 are examples of a flexible lighting device according to an embodiment of the invention.
Figure 13:
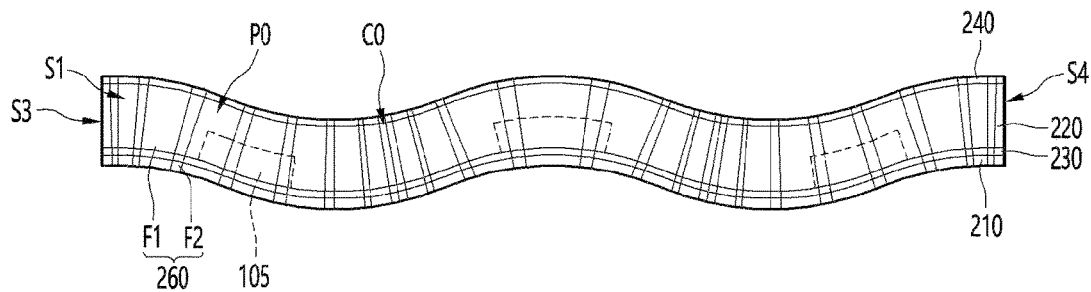

As shown in FIG. 12, the lighting device according to the embodiment is convexly bent in a downward direction or a substrate direction toward the center region with respect to the third and fourth surfaces S3 and S4, or may be convexly curved in an up direction or a direction of the second reflective layer. As shown in FIG. 13, the lighting device according to the embodiment may include a convex region in an up direction or in a direction of the second reflective layer toward the four surface S4 from the third surface S3, and at least one concave region in a down direction or a substrate direction between the convex regions or between the convex region and an adjacent region. The convex region and the concave region may be alternately arranged with each other.

The embodiments, modifications, or other examples disclosed above may be selectively mixed with each other or replaced with structures of other examples, and the embodiments disclosed above may be selectively applied to each example. In addition, a reflective layer or a reflective film made of a resin material may be attached to the second, third and fourth surfaces S2, S3, and S4 of the resin layer 220 except for the first surface. Such a reflective layer or reflective film may block light leakage in the non-emissive region.

Figure 14:
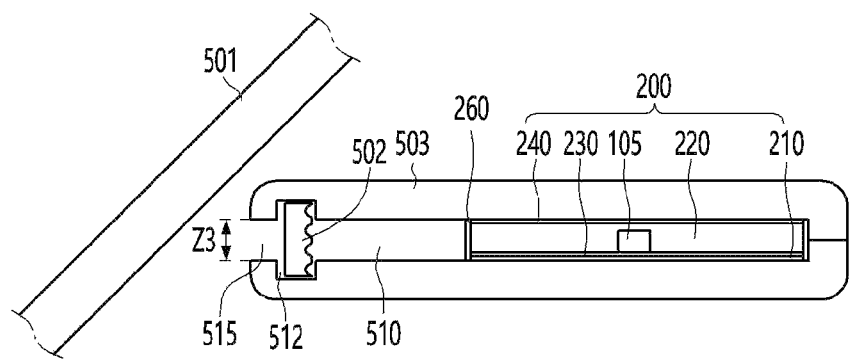
FIG. 14 is an example of a lamp to which a lighting device according to an embodiment of the invention is applied.

In an embodiment of the invention, when the thickness of the resin layer 220 is provided to be 3 mm or less in the lighting device, or to be thicker, for example, in a range of 3 mm to 6 mm, the light emitting area is increased due to the increase in the thickness of the resin layer 220, and light distribution may be improved. The lighting device according to an embodiment of the invention may be applied to a lamp as shown in FIG. 14. The lamp is an example of a vehicle lamp, and is applicable to the vehicle lamp such as a head lamp, a side lamp, a side mirror lamp, a fog lamp, a tail lamp, a brake lamp, a daytime running lamp, a vehicle interior lighting, a door scar, a rear combination lamp, or a backup lamp.

Referring to FIG. 14, the lighting device 200 having the first and second light emitting devices 101 and 103 described above may be coupled to the lamp inside a housing 503 having an inner lens 502. The thickness of the lighting device 200 is such that it may be inserted into the inner width of the housing 503. The width Z3 of the emission portion 515 of the inner lens 502 may be equal to or less than twice the thickness of the lighting device 200, thereby preventing a decrease in luminous intensity. The inner lens 502 may be spaced apart from the front surface of the lighting device 200 by a predetermined distance, for example, 10 mm or more. An outer lens 501 may be disposed on the emission side of the inner lens 502. The lamp having such a lighting device 200 is an example, and may be applied to other lamps in a flexible structure, for example, a curved or curved structure when viewed from the side.

Features, structures, effects, etc. described in the above embodiments are included in at least one embodiment of the invention, and are not necessarily limited to only one embodiment. Furthermore, features, structures, effects, etc. illustrated in each embodiment may be combined or modified for other embodiments by those of ordinary skill in the art to which the embodiments belong. Accordingly, the contents related to such combinations and modifications should be interpreted as being included in the scope of the invention.

The invention claimed is:

1. A lighting device comprising:
a substrate;
a plurality of light emitting devices disposed on the substrate;
a first reflective layer disposed on the substrate;
a resin layer disposed on the first reflective layer and including a first surface from which light emitted from the light emitting device is extracted;
a second reflective layer disposed on the resin layer; and
a light extraction layer disposed on the first surface of the resin layer,
wherein the first surface of the resin layer includes a plurality of convex portions having a convex exit surface facing to each of the plurality of light emitting devices, and a plurality of concave surfaces respectively disposed between the plurality of convex portions,
wherein the light extraction layer includes a first extraction portion having a plurality of protrusions disposed on the first surface of the resin layer and a second extraction portion disposed between the plurality of protrusions of the first extraction portion.

2. The lighting device of claim 1, wherein the light extraction layer is disposed on one side of the substrate and the first and second reflective layers.

3. The lighting device of claim 1, wherein the first surface of the resin layer is an outer surface between the first and second reflective layers,
wherein a vertical height of the first extraction portion is greater than a thickness of the resin layer.

4. The lighting device of claim 1,
wherein the resin layer includes a recess portion concave toward the second surface facing to the first surface of the resin layer,
wherein the resin layer includes third and fourth surfaces facing to each other on both sides of the first and second surfaces, and
wherein the light extraction layer is disposed on the concave surface.

5. The lighting device of claim 1, wherein a maximum width of the first extraction portion is smaller than a height in a vertical direction thereof,
wherein a side cross-sectional shape of the first extraction portion includes a hemispherical shape or a triangular shape.

6. The lighting device of claim 1, wherein the light extraction layer comprises any one of PTN, PET, and PEN.

7. The lighting device of claim 1, wherein the exit surface of the resin layer overlaps each of the light emitting devices in a first direction,
wherein each of the concave surfaces does not overlap each of the light emitting devices in the first direction,
wherein the first extraction portion is disposed to overlap each of the plurality of light emitting devices in a plurality.

8. The lighting device of claim 1, wherein an inner surface of the light extraction layer is adhered along the first surface of the resin layer.

9. The lighting device of claim 1, wherein a portion of each of the plurality of light emitting devices is disposed in a virtual circle passing through each of the plurality of convex portions.

10. The lighting device of claim 4, wherein the light extraction layer extends to the third and fourth surfaces of the resin layer.

11. A lighting device comprising:
a substrate;
a plurality of light emitting devices disposed on the substrate;
a first reflective layer disposed on the substrate;
a resin layer disposed on the first reflective layer and including a first surface from which light emitted from the light emitting device is extracted;
a second reflective layer disposed on a first side surface of the resin layer; and
a light extraction layer disposed on the first surface of the resin layer,
wherein the plurality of light emitting devices is disposed in the resin layer and includes an emitting portion for emitting light toward the first surface of the resin layer, wherein the first surface of the resin layer is a second side surface of the resin layer, wherein the first surface of the resin layer includes a plurality of convex portions having a convex exit surface facing to each of the plurality of light emitting devices, and a plurality of concave surfaces disposed between the plurality of convex portions, and wherein the light extraction layer includes a plurality of protrusions disposed on the first surface of the resin layer and a plurality of grooves respectively disposed between the plurality of protrusions.

12. The lighting device of claim 11, wherein the light extraction layer is disposed on the plurality of convex portions.

13. The lighting device of claim 11, wherein the light extraction layer is in contact with the plurality of convex portions and the plurality of concave surfaces.

14. The lighting device of claim 11, wherein one side surface of the substrate and one side surface of the first reflective layer are disposed on a same plane.

15. The lighting device of claim 11, wherein the first surface of the resin layer is an outer surface between the first and second reflective layers, wherein a vertical height of the light extraction layer is greater than a thickness of the resin layer.

16. The lighting device of claim 11, wherein the resin layer is concave toward a second surface direction opposite to the first surface of the resin layer and includes a plurality of recess portions having each of the concave surfaces, wherein the resin layer includes third and fourth surfaces corresponding to each other on both sides of the first and second surfaces, wherein the light extraction layer extends to a portion of the third surface and the fourth surface.

17. The lighting device of claim 11, wherein the protrusion and the groove are alternately disposed on each of the plurality of convex portions.

18. The lighting device of claim 11, wherein the light extraction layer comprises any one of PTN, PET, and PEN.

19. The lighting device of claim 11, wherein the exit surface of the resin layer overlaps each of the light emitting devices in a first direction, wherein the concave surface does not overlap the plurality of light emitting devices in the first direction, wherein each of the plurality of light emitting devices, the plurality of protrusions overlaps in the first direction.

20. The lighting device of claim 11, wherein an inner surface of the light extraction layer is adhered along the first surface of the resin layer, wherein a portion of each of the plurality of light emitting devices is disposed in a virtual circle passing through each of the plurality of convex portions.

* * * * *